United States Patent (10) Patent No.: US 8,704,268 B2
Kimura et al. (45) Date of Patent: Apr. 22, 2014

(54) SEMICONDUCTOR LIGHT EMITTING DEVICE

(75) Inventors: Shigeya Kimura, Kanagawa-ken (JP); Koichi Tachibana, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/404,531

(22) Filed: Feb. 24, 2012

(65) Prior Publication Data

US 2013/0087805 A1 Apr. 11, 2013

(30) Foreign Application Priority Data

Oct. 11, 2011 (JP) ................................. 2011-224366

(51) Int. Cl.
*H01L 33/30* (2010.01)

(52) U.S. Cl.
USPC ................. 257/103; 257/13; 257/14; 257/15; 257/76

(58) Field of Classification Search
USPC ..................... 257/76, 13, 14, 15, 79, 98, 103
See application file for complete search history.

(56) References Cited

U.S. PATENT DOCUMENTS

2007/0085097 A1 4/2007 Kim et al.
2009/0050875 A1 2/2009 Kim et al.

FOREIGN PATENT DOCUMENTS

JP 2007-116147 5/2007

OTHER PUBLICATIONS

U.S. Appl. No. 13/214,690, filed Aug. 22, 2011, Tomonari Shioda, et al.

*Primary Examiner* — Howard Weiss
*Assistant Examiner* — Tifney Skyles
(74) *Attorney, Agent, or Firm* — Oblon, Spivak, McClelland, Maier & Neustadt, L.L.P.

(57) ABSTRACT

According to one embodiment, a semiconductor light emitting device includes an n-type semiconductor layer, a p-type semiconductor layer and a light emitting layer. The emitting layer is provided between the n-type layer and the p-type layer, and includes a plurality of barrier layers and a plurality of well layers, being alternately stacked. The p-side barrier layer being closest to the p-type layer among the plurality of barrier layer includes a first layer and a second layer, containing group III elements. An In composition ratio in the group III elements of the second layer is higher than an In composition ratio in the group III elements of the first layer. An average In composition ratio of the p-side layer is higher than an average In composition ratio of an n-side barrier layer that is closest to the n-type layer among the plurality of barrier layers.

20 Claims, 11 Drawing Sheets

US 8,704,268 B2

SEMICONDUCTOR LIGHT EMITTING DEVICE

CROSS-REFERENCE TO RELATED APPLICATIONS

This application is based upon and claims the benefit of priority from the prior Japanese Patent Application No. 2011-224366, filed on Oct. 11, 2011; the entire contents of which are incorporated herein by reference.

FIELD

Embodiments described herein relate generally to a semiconductor light emitting device.

BACKGROUND

Nitride-based III-V group compound semiconductors such as gallium nitride (GaN) are applied to a high-intensity light emitting diode (LED), a laser diode (LD), and the like, by taking advantage of their features of a wide band gap.

Each of these light emitting devices includes: an n-type semiconductor layer; a p-type semiconductor layer; and a light emitting layer provided between them and having a quantum well layer and a barrier layer.

Such semiconductor light emitting devices are being required to realize a high light emission efficiency.

DETAILED DESCRIPTION

Figure 1A:
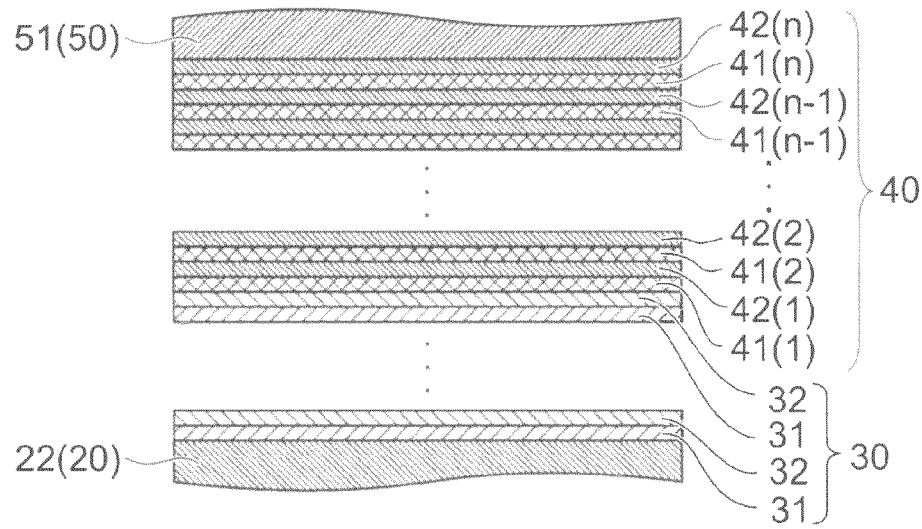
FIGS. 1A to 1B are schematic cross-sectional view illustrating the configuration of a part of a semiconductor light emitting device according to the embodiment.

According to one embodiment, a semiconductor light emitting device includes an n-type semiconductor layer, a p-type semiconductor layer and a light emitting layer. The n-type semiconductor layer contains a nitride semiconductor. The p-type semiconductor layer contains a nitride semiconductor. The light emitting layer is provided between the n-type semiconductor layer and the p-type semiconductor layer. The light emitting layer includes a plurality of barrier layers and a plurality of well layers. The plurality of barrier layers and the plurality of well layers are alternately stacked. The p-side barrier layer that is closest to the p-type semiconductor layer among the plurality of barrier layer has a first layer containing group III elements, and a second layer containing group III elements. The second layer is stacked with the first layer. When at least the second layer contains In, An In composition ratio in the group III elements of the second layer is higher than an In composition ratio in the group III elements of the first layer. An average In composition ratio of the p-side barrier layer is higher than an average In composition ratio of an n-side barrier layer that is closest to the n-type semiconductor layer among the plurality of barrier layers.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

(Embodiment)

Figure 1B:
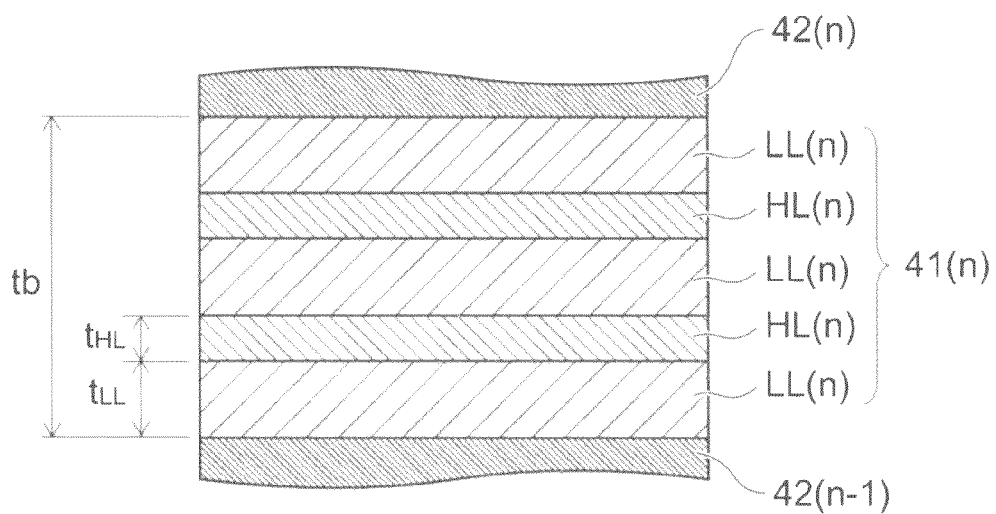

FIGS. 1A to 1B are schematic cross-sectional view illustrating the configuration of a part of a semiconductor light emitting device according to the embodiment.

FIG. 1A is the schematic cross-sectional view of the semiconductor light emitting device and FIG. 1B is the schematic cross-sectional view of a barrier layer.

Figure 2:
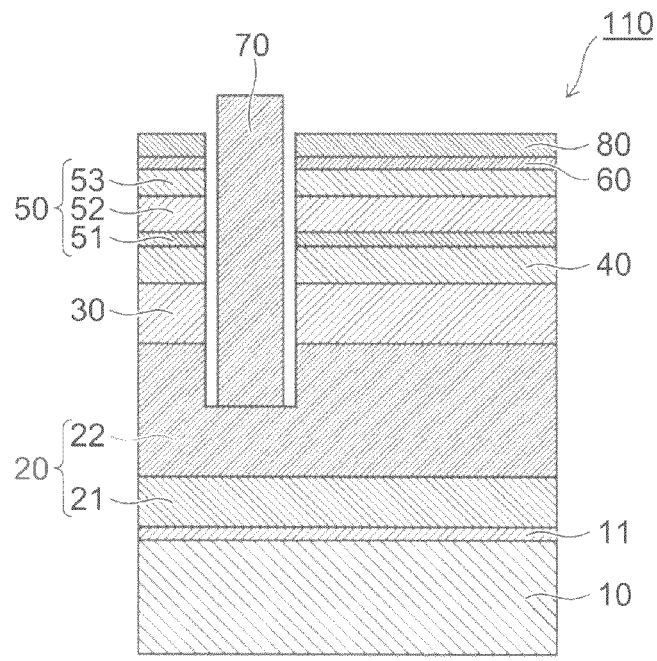
FIG. 2 is a schematic cross-sectional view illustrating the configuration of the semiconductor light emitting device according to the embodiment.

FIG. 2 is a schematic cross-sectional view illustrating the configuration of the semiconductor light emitting device according to the embodiment.

As shown in FIG. 2, the semiconductor light emitting device 110 according to the embodiment includes: an n-type semiconductor layer 20; a p-type semiconductor layer 50; and a light emitting layer 40 provided between the n-type semiconductor layer 20 and the p-type semiconductor layer 50. In the semiconductor light emitting device 110, a stacked body 30 may be provided between the light emitting layer 40 and the n-type semiconductor layer 20.

Each of the n-type semiconductor layer 20 and the p-type semiconductor layer 50 contains a nitride semiconductor.

The light emitting layer 40 is, for example, an active layer. The stacked body 30 is, for example, a super-lattice layer.

In the semiconductor light emitting device 110, the buffer layer 11 is provided on a major surface (for example, c-plane) of a substrate 10 composed of, for example, sapphire, and, for example, an undoped-GaN foundation layer 21 and an n-type GaN contact layer 22 are provided thereon. The n-type GaN contact layer 22 is included in the n-type semiconductor layer 20. The GaN foundation layer 21 may also be included in the n-type semiconductor layer 20 for convenience.

A stacked body 30 is provided on the n-type GaN contact layer 22. In the stacked body 30, for example, first crystal layers 31 and second crystal layers 32 are stacked alternatively.

On the stacked body 30, the light emitting layer 40 (active layer) is provided. The light emitting layer 40 has, for example, a multiple quantum well (MQW) structure. That is, the light emitting layer 40 includes the structure in which a plurality of barrier layers 41 and a plurality of well layers 42 are stacked alternatively and repeatedly. The detailed configuration of the barrier layer 41 and the well layer 42 will be described later.

On the light emitting layer 40, a p-type AlGaN layer 51, a Mg doped GaN layer 52, and a p-type GaN contact layer 53, are provided in this order. The p-type AlGaN layer 51 has a function as an electron overflow suppression layer. The p-type AlGaN layer 51, the Mg doped GaN layer 52, and the p-type GaN contact layer 53, are included in the p-type semiconductor layer 50. Furthermore, a transparent electrode 60 is provided on the p-type GaN contact layer 53.

Then, an n side electrode 70 is provided on the n-type GaN contact layer 22 by removing a part of the n-type GaN contact layer 22, which is the n-type semiconductor layer 20, and areas of the stacked body 30, the light emitting layer 40, and the p-type semiconductor layer 50, which correspond to the part. A stacked structure of, for example, Ti/Pt/Au is used for the n side electrode 70, for example. In contrast, a p side electrode 80 is provided on the transparent electrode 60.

As described above, the semiconductor light emitting device 110 of the specific example according to the embodiment is a light emitting diode (LED).

The semiconductor light emitting device 110 can be manufactured, for example, as follows.

First, the substrate 10 of, for example, a c-plane sapphire subjected to organic cleaning or acid cleaning, is introduced into a reactor of MOCVD (Metal Organic Chemical Vapor Deposition) apparatus, and is heated to about 1100° C. on a susceptor in the reactor. Thereby, the oxide film of the surface of the substrate 10 is removed.

Next, the buffer layer 11 is grown on the major surface (c-plane) of the substrate 10 at a thickness of 30 nm. Furthermore, an undoped GaN foundation layer 21 of is grown on the buffer layer 11 at a thickness of 3 micrometer (µm). Moreover, an n-type GaN contact layer 22 composed of Si doped GaN is grown on the GaN foundation layer 21 at a thickness of 2 µm.

Next, on the n-type GaN contact layer 22, the stacked body 30 is formed by stacking the first crystal layers 31 composed of $In_xGa_{1-x}N$, and second crystal layers 32 composed of $In_yGa_{1-y}N$, alternatively by 30 periods.

Next, the barrier layers 41 and the well layers 42 are alternatively stacked on the stacked body 30.

Furthermore, a 5 nm thick AlGaN layer having Al composition ratio of 0.003 is grown on the top barrier layer 41, and subsequently, a 10 nm thick Mg doped AlGaN layer 51 having Al composition ratio of 0.1, a 80 nm thick Mg doped p-type GaN layer 52 (Mg concentration is $2 \times 10^{19}/cm^3$), and an about 10 nm thick high concentration Mg doped GaN layer 53 (Mg concentration is $1 \times 10^{21}/cm^3$), are stacked thereon. Then, the substrate on which the above-mentioned crystals are grown is taken out from the reactor of MOCVD apparatus.

Next, a part the multilayered film structure is exposed by subjecting the n-type GaN contact layer 22 to dry etching to the middle, and the n-side electrode 70 of Ti/Pt/Au is formed thereon. Furthermore, the transparent electrode 60 composed of ITO (Indium Tin Oxide) is formed on the surface of the high concentration Mg doped GaN layer 53, and the p-side electrode 80 composed of Ni/Au with diameter of, for example, 80 µm is formed in a part of the transparent electrode 60. Thereby, the semiconductor light emitting device 110 is fabricated.

Although, the example using MOCVD (metalorganic chemical vapor deposition) method as a film formation method have been described above, another method, such as for example, a molecular beam epitaxial (MBE) method or a halide vapor phase epitaxial (HVPE) method, is also applicable.

Next, the multiple quantum well structure of the light emitting layer 40 will be described.

As shown in FIGS. 1A and 1B, the multi quantum wells structure of the light emitting layer 40 has a plurality of barrier layers 41(1) to 41(n) and a plurality of well layers 42(1) to 42(n). In addition, "n" contained in reference numerals is an integer not less than 2, corresponding to the number of the layer.

In the specification, when the plurality of barrier layers 41(1) to 41(n) and the plurality of well layers 42(1) to 42(n) are referred to without being distinguished, they are referred to as the barrier layers 41 and the well layers 42, respectively.

The plurality of well layers 41 have the first well layer 42(1), the second well layer 42(2), - - -, the (n−1)-th well layer 42(n−1), and the n-th well layer 42(n) from the n-type semiconductor layer 20 toward the p-type semiconductor layer 50. Among the plurality of barrier layers 41, the first barrier layer 41(1) that is closest to the n-type semiconductor layer 20 is also referred to as an n-side barrier layer, and the n-th barrier layer 41(n) that is closest to the p-type semiconductor layer 50 is also referred to as a p-side barrier layer.

The plurality of well layers 42 have the first well layer 42(1), the second well layer 42(2), - - -, the (n−1)-th well layer 42(n−1), and the n-th well layer 42(n) from the n-type semiconductor layer 20 toward the p-type semiconductor layer 50. Among the plurality of well layers 42, the first well layer 42(1) that is closest to the n-type semiconductor layer 20 is also referred to as an n-side well layer, and the n-th well layer 42(n) that is closest to the p-type semiconductor layer 50 is also referred to as a p-side well layer.

The barrier layers 41 and the well layers 42 contain a nitride semiconductor. The barrier layers 41 and the well layers 42 may contain a slight amount of Al or the like.

For example, a nitride semiconductor containing In is used for the well layer 42. Band gap energy of the barrier layer 41 is larger than band gap energy of the well layer 42.

The well layer 42 contains $In_wGa_{1-w}N$ (0<w<1). The thickness of the well layer 42 is represented as $t_w$ (nanometers). The thickness $t_w$ of the well layer 42 is, for example, not less than 3 nanometers (nm) and not more than 6 nm.

In the semiconductor light emitting device 110, at least the n-th barrier layer 41(n) includes a first layer LL(n) and a second layer HL(n).

In the case where the m-th (1<m<n) barrier layer 41(m) as an intermediate barrier layer exists between the nth barrier layer 41(n) as the p-side barrier layer and the first barrier layer 41(1) as the n-side barrier layer, the first layer LL(m) provided in the m-th barrier layer 41 (m) is a third layer, and the second layer HL(m) is a fourth layer.

The first layer LL is also called when the first layers are collectively called irrespective of the layer number. The second layer HL is also called when the second layers are collectively called irrespective of the layer number.

The first layer LL contains group III elements. The first layer LL contains, for example, $In_{b1}Ga_{1-b1}N$ (0≤b1). The second layer HL has a higher In composition ratio in the group III elements than the In composition ratio in the group III elements of the first layer LL. The second layer HL(n) contains, for example, $In_{b2}Ga_{1-b2}N$ (b1<b2).

Band gap energy of the second layer HL is smaller than band gap energy of the first layer LL.

In one barrier layer 41, a plurality of first layers LL are provided and one or more second layers HL are provided. The second layer HL is provided between the plurality of first layers LL.

In the semiconductor light emitting device 110, an average In composition ratio in the thickness direction of the n-th barrier layer 41(n) as the p-side barrier layer is higher than an average In composition ratio in the thickness direction of the first barrier layer 41(1) as the n-side barrier layer.

Here, the average In composition ratio in the thickness direction of the barrier layer 41 is referred to as an average In composition ratio.

That is, when the first layer LL contains $In_{b1}Ga_{1-b1}N$ (0≤b1) and has a thickness $t_{LL}$ (nanometers) and has the second layer HL contains $In_{b2}Ga_{1-b2}N$ (b1<b2) and has a thickness $t_{HL}$ (nanometers), the average In composition ratio of the barrier layer 41 is defined as $(b1 \times t_{LL} + b2 \times t_{HL})/(t_{LL} + t_{HL})$.

The first layer LL and the second layer HL may be provided in each of the plurality of barrier layers 41. When the first layer LL and the second layer HL are provided in each of the plurality of barrier layers 41, an In composition ratio b2 of the second layer HL may vary for each of the plurality of barrier layers 41.

In this case, the average In composition ratios of the plurality of barrier layers 41 are in a stepwise fashion decreased from the barrier layer 41 close to the p-type semiconductor layer 50 toward the barrier layer 41 close to the n-type semiconductor layer 50.

For example, when the m-th (1<m<n) barrier layer 41(m) as the intermediate barrier layer exists between the n-th barrier layer 41(n) as the p-side barrier layer and the first barrier layer 41(1) as the n-side barrier layer, an average In composition ratio of the m-th barrier layer 41(m) is set to be lower than the average In composition ratio of the n-th barrier layer 41(n) and to be higher than the average In composition ratio of the first barrier layer 41(1).

As a specific example, the barrier layer 41 closer to the p-type semiconductor layer 50 has a larger In composition ratio b2, the barrier layer 41 closer to the n-type semiconductor layer 20 has a smaller In composition ratio b2.

The average In composition ratios of the plurality of barrier layers 41 need not be different from each other according to each barrier layer 41. For example, in the case where the adjacent barrier layers 41 is set to one pair and a plurality of pairs are configured, the average In composition ratios of the barrier layers 41 in the same pair may be the same and for each pair, the average In composition ratios may be in a stepwise fashion decreased from the p-type semiconductor layer 50 toward the n-type semiconductor layer 20.

For example, in a pair of the first barrier layer 41(1) and the second barrier layer 41(2), a pair of the third barrier layer 41(3) and the fourth barrier layer 41(4), . . . , a pair of the (n−3)-th barrier layer 41(n−3) and the (n−2)-th barrier layer 41(n−2) and a pair of the (n−1)-th barrier layer 41(n−1) and the n-th barrier layer 41(n), it may be configured that the average In composition ratios of the barrier layers 41 belonging to the same pair are the same, and the average In composition ratios for each pair may be gradually decreased from the p-type semiconductor layer 50 toward the n-type semiconductor layer 20.

Alternatively, in the case where the plurality of barrier layers 41 are divided into a pair on the side of the p-type semiconductor layer 50 (p-side pair) and a pair on the side of the n-type semiconductor layer 20 (n-side pair), it may be configured that one or more barrier layers 41 in the p-side pair has a composition ratio b21 (b21>0) and one or more barrier layers 41 in the n-side pair has a composition ratio b22 (b22<b21).

By configuring the multiple quantum well structure of the light emitting layer 40 in this manner, quantum potential of the barrier layers 41 with respect to the well layers 42 lowers. For this reason, hole injection into the multiple quantum well is made efficient and carrier is dispersed, thereby improving the external quantum efficiency of the LED.

Next, a specific example of the barrier layers 41 and the well layers 42 of the semiconductor light emitting device 110 according to the embodiment will be described.

In the semiconductor light emitting device 110 according to the embodiment, a thickness $t_b$ of the barrier layers 41 is decreased to be not more than 10 nm. Preferably, the thickness $t_b$ is set to be not less than 3 nm and not more than 8 nm. Therefore, the holes injected from the p-type semiconductor layer 50 are efficiently supplied to the light emitting layer 40, thereby improving the light emitting efficiency of the semiconductor light emitting device 110. An operating voltage of the semiconductor light emitting device 110 is decreased to the practically demanded extent.

In the semiconductor light emitting device 110 according to the embodiment, preferably, the thickness $t_{LL}$ of the first layer LL in the barrier layer 41 is set to be less than 3 nm and more preferably, to about 1 nm. As a result, quantum potential for the holes of the barrier layers 41 with respect to the well layers 42 decreases.

In the semiconductor light emitting device 110 according to the embodiment, it is desired that the thickness $t_{HL}$ of the second layer HL in the barrier layer 41 is set to be not more than 2 nm. When the second layer HL is further thickened, crystallinity of the barrier layers 41 tends to degrade.

In the semiconductor light emitting device 110 according to the embodiment, the In composition ratio b1 of the first layer LL in the barrier layer 41 is set desirably to be not more than 0.02, more desirably to be 0.00. When the In composition ratio is further increased, crystallinity tends to degrade.

In the semiconductor light emitting device 110 according to the embodiment, the In composition ratio b2 of the second layer HL(n) in the n-th barrier layer 41(n) as the p-side barrier layer is set to preferably not less than 0.04 and not more than 0.13, more preferably, to not less than. Thus, decrease in the quantum potential for the holes of the barrier layers 41 with respect to the well layers 42 becomes more effective.

By configuring such barrier layers 41 having the first layer LL and the second layer HL in the multi-quantum well layer, hole injection efficiency in the quantum well layer is improved to achieve a high light emitting efficiency.

Figure 3:
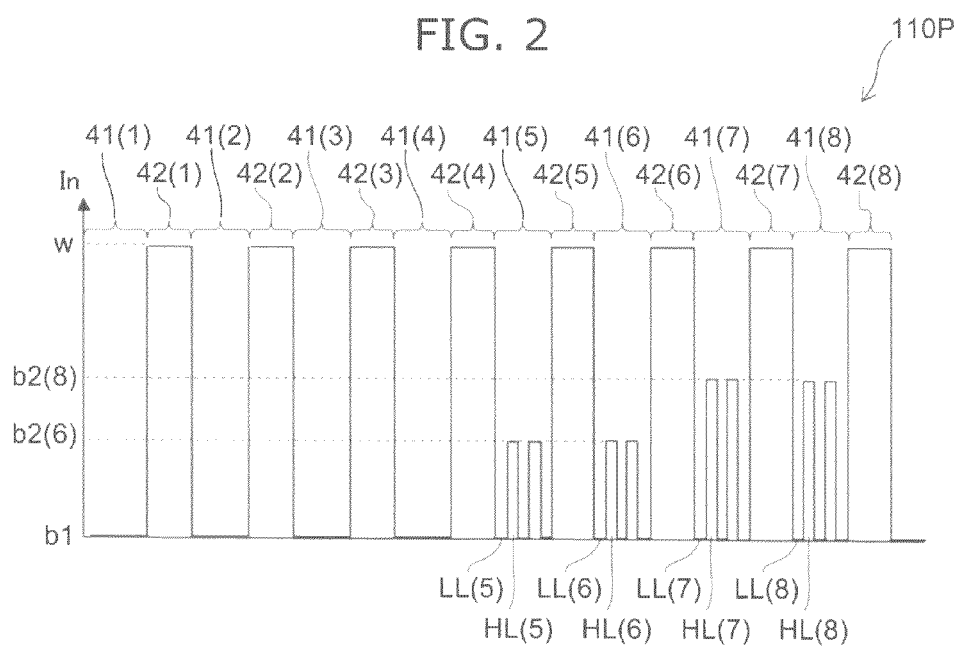
FIGS. 3 and 4 are views illustrating an In composition ratio of the semiconductor light emitting device according to the embodiment.
Figure 4:
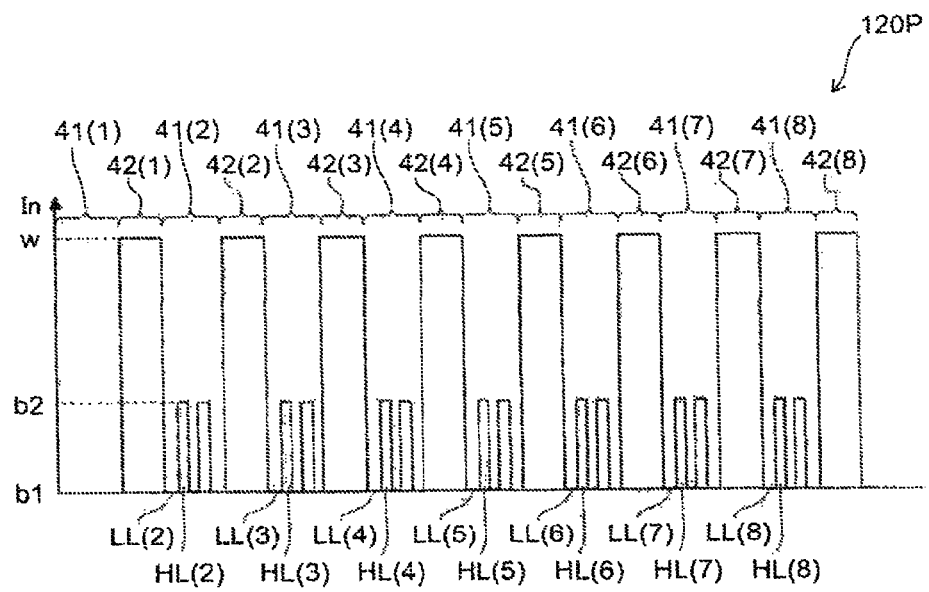
Figure 5:
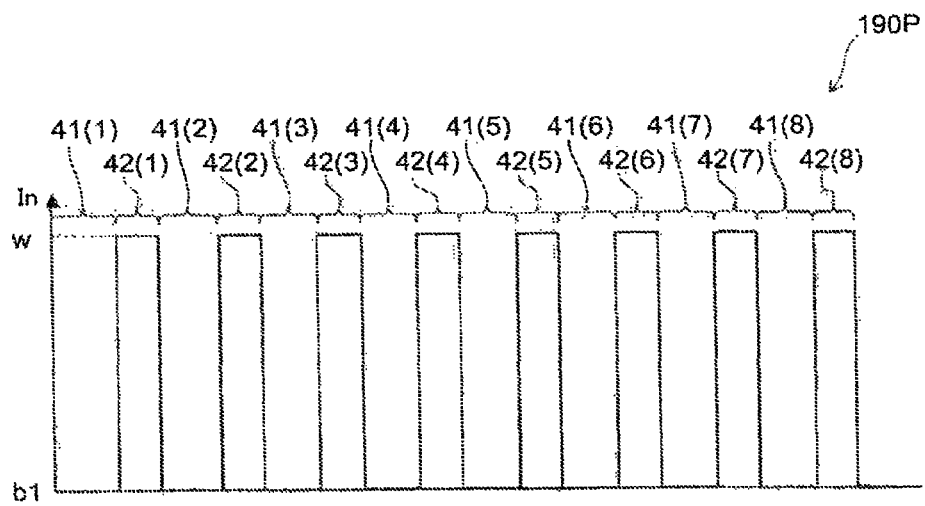
FIG. 5 is a view illustrating an In composition ratio of a semiconductor light emitting device according to a reference example.

FIG. 3 to FIG. 5 are views illustrating profile of the In composition ratio of the light emitting layer.

In all of FIG. 3 to FIG. 5, a horizontal axis represents position of the light emitting layer (position in the thickness direction), and a vertical axis represents the In composition ratio. FIG. 3 and FIG. 4 shows examples of the semiconductor light emitting device according to the embodiment, and FIG. 5 shows an example of a semiconductor light emitting device according to a reference example.

In the examples shown in FIG. 3 to FIG. 5, the In composition ratio profile in the multiple quantum well structure in which the eight barrier layers 41 and the eight well layers 42 are alternately stacked.

Here, the In composition ratio profile shown in FIG. 3 is referred to as 110P, the In composition ratio profile shown in FIG. 4 is referred to as 120P and the In composition ratio profile shown in FIG. 5 is referred to as 190P.

In the In composition ratio profile 110P shown in FIG. 3, the average In composition ratio decreases every pair of the two barrier layers 41.

In the In composition ratio profile 110P, the In composition ratios of the well layers 42(1) to 42(8) are the same. The composition ratio w of the well layers 42(1) to 42(8) is, for example, 0.13.

The three first layers LL and the two second layers HL are provided in each of the eighth barrier layer 41(8), the seventh barrier layer 41(7), the sixth barrier layer 41(6) and the fifth barrier layer 41(5) in the barrier layers 41. The In composition ratios of these first layers LL are the same. The In composition ratio b1 of the first layer LL is, for example, 0.00.

The In composition ratios of the second layer HL(8) in the eighth barrier layer 41(8) and the second layer HL(7) in the seventh barrier layer 41(7) in the plurality of barrier layers 41 are the same.

The In composition ratio b2(8) of the second layers HL(8) and HL(7) is, for example, not less than 0.04 and not more than 0.13. As an example, the In composition ratio b2(8) is 0.06. The In composition ratio b2(8) may be set to, for example, be not more than half of the In composition ratio w of the eighth well layer 42(8) as the p-side well layer.

The In composition ratios of the second layer HL(6) in the sixth barrier layer 41(6) and the second layer HL(5) in the fifth barrier layer 41(5) in the plurality of barrier layers 41 are the same, but are lower than the In composition ratios of the second layer HL(8) in the eighth barrier layer 41(8) and the second layer HL(7) in the seventh barrier layer 41(7). The In composition ratio b2(6) of the second layers HL(6) and HL(7) is, for example, 0.03.

With such configuration, in the In composition ratio profile 110P, the average In composition ratios of the pair of the eighth barrier layer 41(8) and the seventh barrier layer 41(7) and the pair of the sixth barrier layer 41(6) and the fifth barrier layer 41(5) in a stepwise fashion decrease.

In the In composition ratio profile 120P shown in FIG. 4, the average In composition ratios of the first barrier layer 41(1) as the n-side barrier layer and the second to the eighth barrier layers 41(2) to 41(n) are different from each other.

In the In composition ratio profile 120P, the In composition ratios w of the well layers 42(1) to 42(8) are the same (for example, w=0.13).

The three first layers LL and the two second layers HL are provided in each of the second barrier layer 41(2) to the eighth barrier layer 41(8) in the barrier layers 41. The In composition ratios b1 of these first layers LL(2) to LL(8) are the same (for example, b1=0.00), and the In composition ratios b2 of these second layers HL(2) to HL(8) are higher than the In composition ratio b1 and are the same (for example, b2 =0.06).

In the In composition ratio profile 190P shown in FIG. 5, the second layer HL is not provided in all of the barrier layers 41. That is, the In composition ratio of all barrier layers 41 is constant.

FIG. 6A to FIG. 8D are views illustrating energy band and carrier concentration distribution.

FIGS. 6A to 6D show an example of the semiconductor light emitting device 110 having the In composition ratio profile 110P shown in FIG. 3. FIGS. 7A to 7D show an example of a semiconductor light emitting device 120 having the In composition ratio profile 120P shown in FIG. 4. FIGS. 8A to 8D show an example of a semiconductor light emitting device 190 having the In composition ratio profile 190P shown in FIG. 5.

In all of the figures, a horizontal axis represents position (position in the thickness direction), A represents an energy band of a conduction band, B represents an energy band of a valence band, C represents electron concentration and D represents hole concentration. In all of the figures, thick lines in A and B represent quantum potential.

As shown in FIGS. 8A to 8D, in the semiconductor light emitting device 190 according to the reference example, since quantum barrier of the barrier layers 41 with respect to the well layers 42 is high, the holes injected from the p-type semiconductor layer 50 are biased toward the well layers 42 that are close to the p-type semiconductor layer 50.

In the nitride semiconductor, the mobility of the p-type carrier (hole) is low and thus, the injection efficiency of the holes generated in the p-type semiconductor layer 50 of the LED to the multiple quantum well is poor. For this reason, the holes are injected to only a part of the well layers 42 in the plurality of well layers 42, which are close to the p-type semiconductor layer 50. For this reason, the carrier density locally becomes larger, Auger recombination probability increases, and especially, the external quantum efficiency of the LED at the time of the injection of a high current decreases.

Figure 6A:
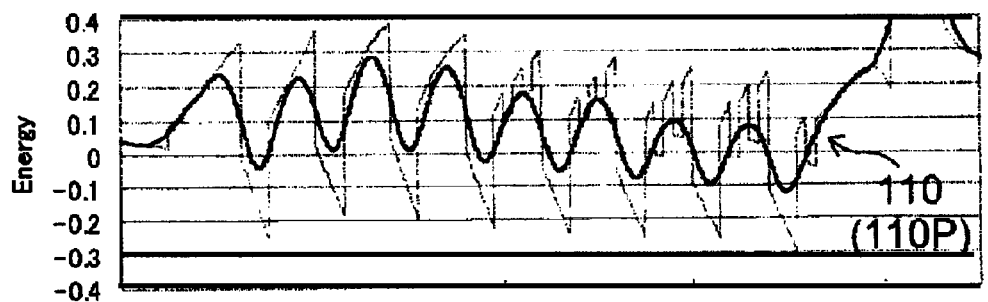
FIGS. 6A to 8D are views illustrating energy band and carrier concentration distribution.
Figure 6B:
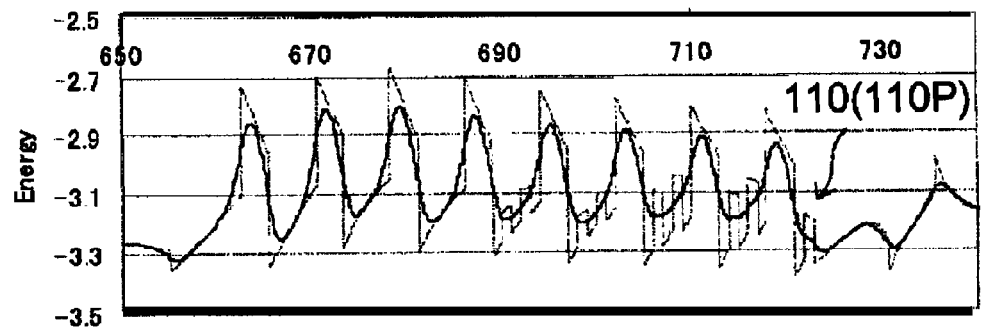
Figure 6C:
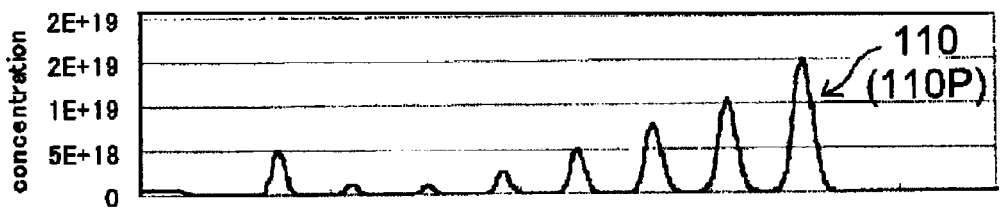
Figure 6D:
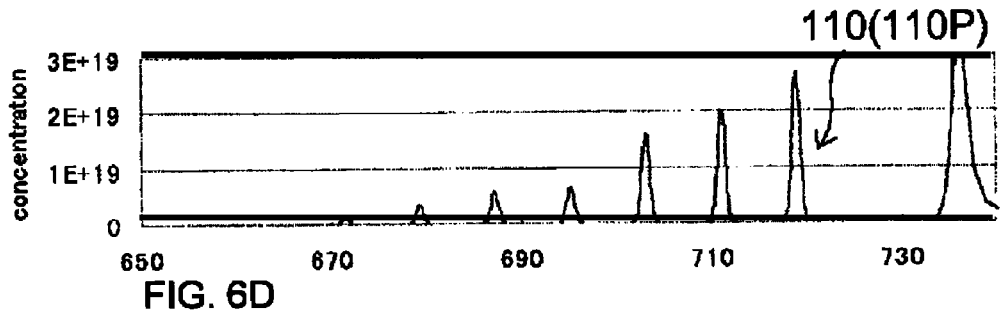

As seen in the energy band of the conduction band in FIG. 6A and the valence band in FIG. 6B, in the semiconductor light emitting device 110, as compared with the semiconductor light emitting device 190 according to the reference example, the quantum barrier of the barrier layers 41 with respect to the well layers 42 decreases. As a result, as shown in FIG. 6D, as compared with the semiconductor light emitting device 190, the hole injection efficiency is dramatically improved and the light emitting efficiency also becomes much higher.

Figure 7A:
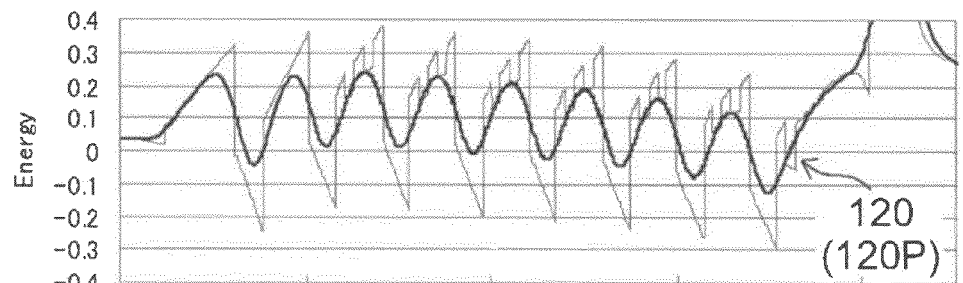
Figure 7B:
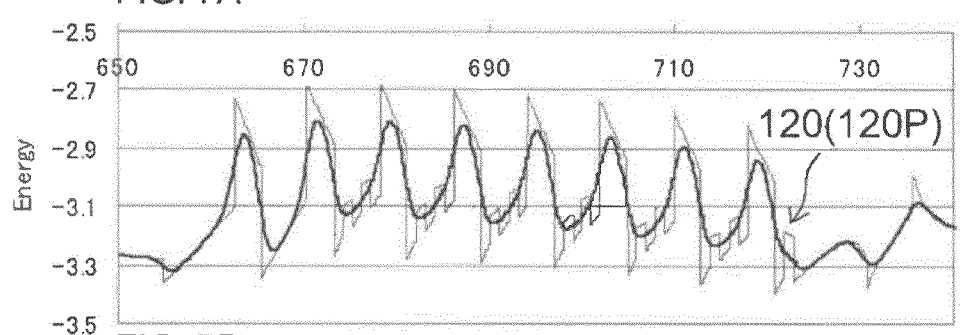
Figure 7C:
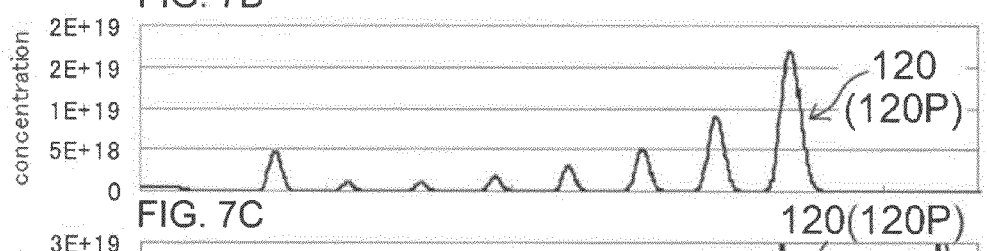
Figure 7D:
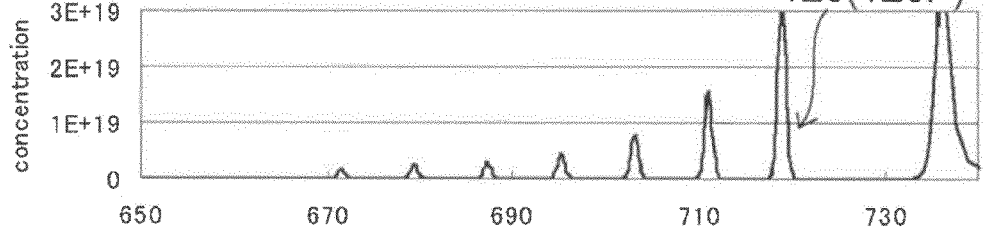
Figure 8A:
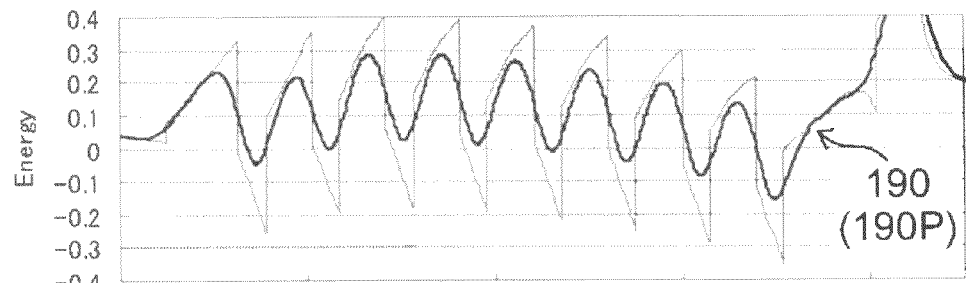
Figure 8B:
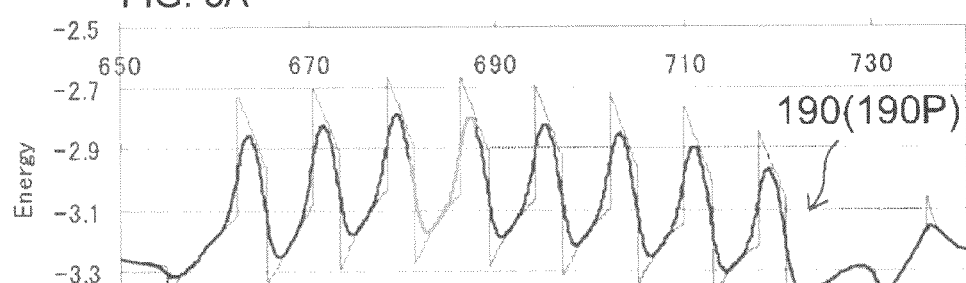
Figure 8C:
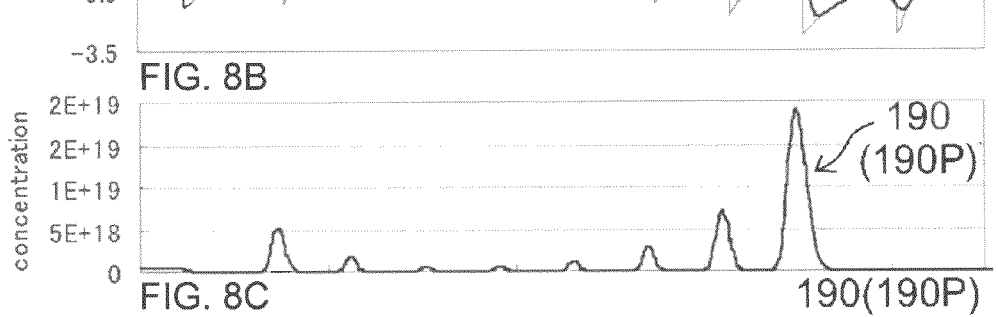
Figure 8D:
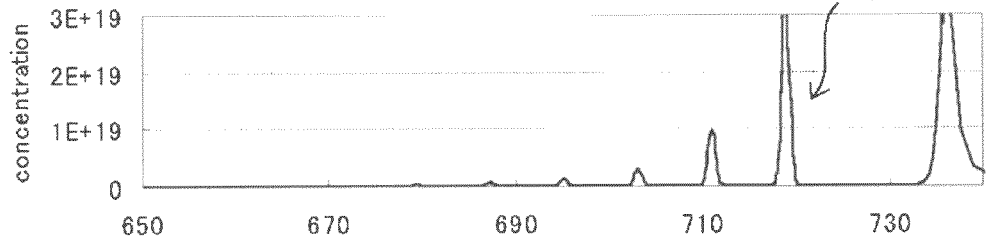

The quantum barrier of the barrier layers 41 with respect to the well layers 42 in the energy band of the conduction band in FIG. 7A and the valence band in FIG. 7B, is not lower than the quantum barrier in the energy band shown in FIGS. 6A and 6B, but is lower than the quantum barrier in the semiconductor light emitting device 190 according to the reference example in FIGS. 8A to 8D. As a result, the semiconductor light emitting device 120 has a higher light emitting efficiency than the semiconductor light emitting device 190 according to the reference example.

Furthermore, as shown in FIGS. 6A to 6D and FIGS. 7A to 7D, by decreasing the average In composition ratios of the barrier layers 41 as the barrier layers are closer to the n-type semiconductor layer 20, crystallinity of the multiple quantum well structure of the light emitting layer 40 grown on the n-type semiconductor layer 20 is improved.

Consideration result that the above-mentioned conditions are found will be described.

In this consideration, the semiconductor light emitting device is configured by varying the configuration of the light emitting layer 40 (how to modulate the thickness and the In composition ratio of the barrier layers 41, and how to modulate the thickness and the In composition ratio of the well layers 42) and the internal quantum efficiencies in respective cases are compared.

FIRST EXAMPLE

A semiconductor light emitting device 111 according to a first example has the In composition ratio profile 110P shown in FIG. 3.

The number of the barrier layers 41 and the number of the well layers 42 each are eight. Among the eight well layers 42, the barrier layer that is closest to the n-type semiconductor layer 20 is referred to as the first barrier layer 41(1), and the barrier layers from the closest to the p-type semiconductor layer 50 are referred to as the second barrier layer 41(2), the third barrier layer 41(3), . . . , the eighth barrier layer 41(8).

The In composition ratio b1 of the first layer LL(8) in the eighth barrier layer 41(8) and the first layer LL(7) in the seventh barrier layer 41(7) is set to 0.00, and the In composition ratio b2(8) of the second layer HL(8) in the eighth barrier layer 41(8) and the second layer HL(7) in the seventh barrier layer 41(7) is set to 0.06.

Next, the In composition ratio b1 of the first layer LL(6) in the sixth barrier layer 41(6) and the first layer LL(5) in the fifth barrier layer 41(5) is set to 0.00, and the In composition ratio b2(6) of the second layer HL(6) in the sixth barrier layer 41(6) and the second layer HL(5) in the fifth barrier layer 41(5) is set to 0.03.

Finally, both of the In composition ratio of the first layers LL(4) to LL(1) in the fourth barrier layer 41(4) to the first barrier layer 41(1) and the In composition ratio of the second layers HL(4) to HL(1) are set to 0.00.

In all of the first barrier layer 41(1) to the eighth barrier layer 41(8), the thickness $t_{LL}$ of the first layers LL(1) to LL(8) is set to 1 nm, the thickness $t_{HL}$ of the second layers HL(1) to HL(8) is set to 1 nm, and the second layers HL are alternately stacked on a 2.5 cycles so as to be located on the both sides of the barrier layers 41. Each of the first barrier layer 41(1) to the eighth barrier layer 41(8) has a thickness $t_b$ of 5 nm.

SECOND EXAMPLE

A semiconductor light emitting device 121 according to a second example has the In composition ratio profile 120P shown in FIG. 4.

In the semiconductor light emitting device 121, the In composition ratio b1 of the first layers LL(2) to LL(8) in the second barrier layer 41(2) to the eighth barrier layer 41(8) is set to 0.00, and the In composition ratio b2 of the second layers HL(2) to HL(8) is set to 0.03. Both of the In composition ratio of the first layer LL(1) in the first barrier layer 41(1) and the In composition ratio of the second layer HL(2) are set to 0.00. The semiconductor light emitting device 121 is the same as the semiconductor light emitting device 111 according to the first example except for these matters.

REFERENCE EXAMPLE

A semiconductor light emitting device 191 of the reference example has the In composition ratio profile 190P shown in FIG. 5.

That is, in the semiconductor light emitting device 191, all of the first barrier layer 41(1) to the eighth barrier layer 41(8) are GaN monolayers.

The In composition ratios w of all of the well layers 42 in the semiconductor light emitting devices 111, 121 and 191 are 0.13 and constant in each layer (that is, $In_{0.13}Ga_{0.87}N$) and the thickness $t_w$ is 3 nm.

The semiconductor light emitting devices 111, 121 and 191 each are a blue LED that emits light having a main wavelength of 450 nm.

Figure 9:
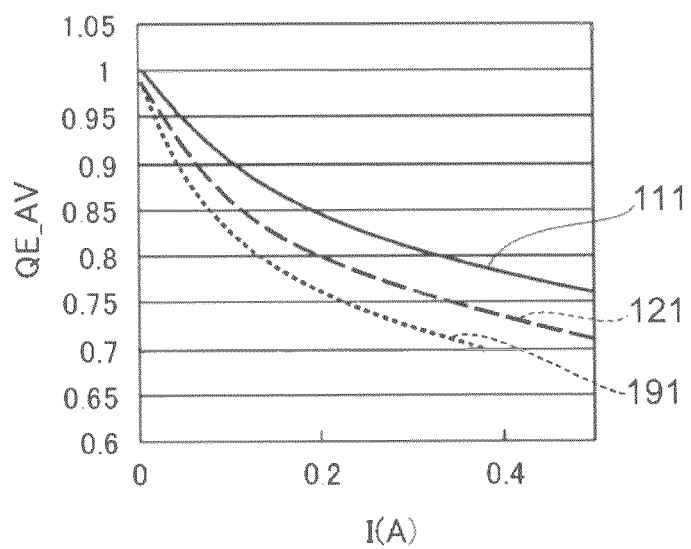
FIG. 9 is a view illustrating characteristics of the semiconductor light emitting devices.

FIG. 9 is a view illustrating characteristics of the semiconductor light emitting devices.

In FIG. 9, a horizontal axis represents an current I (ampere: A), and a vertical axis represents an internal quantum efficiency QE_AV. FIG. 9 shows the current I and the internal quantum efficiency QE_AV in the semiconductor light emitting devices 111, 121 and 191. In FIG. 9, the internal quantum efficiency along the vertical axis is expressed as a relative value using a peak value of the internal quantum efficiency of the semiconductor light emitting device 191 according to the reference example as "1".

As shown in FIG. 9, the internal quantum efficiency QE_AV of the semiconductor light emitting device 111 according to the first example is the highest, and the internal quantum efficiency QE_AV of the semiconductor light emitting device 121 according to the second example is high. The internal quantum efficiency QE_AV of both the semiconductor light emitting device 111 and 112 becomes elevated as compared with the internal quantum efficiency QE_AV of the semiconductor light emitting device 191 according to the reference example. For example, the internal quantum efficiency QE_AV at the current I of 0.2 A is 0.84 in the semiconductor light emitting device 111, 0.80 in the semiconductor light emitting device 121 and 0.76 in the semiconductor light emitting device 191.

In the semiconductor light emitting device 191, when the second layer HL is provided in the barrier layer separated from the p-side barrier layer toward the n-type semiconductor layer across four or more barrier layers, the effect of increasing the hole injection efficiency is small.

In the embodiment, by providing the second layer HL in the p-side barrier layer 41(n), the hole injection efficiency is improved. At this time, as can be seen from FIG. 6D, the holes are efficiently injected up to the fourth barrier layer (that is, the fifth barrier layer 41(5) from eighth barrier layer 41(8) as the p-side barrier layer toward the n-type semiconductor layer 20. However, the holes are not efficiently injected to the barrier layers closer to the n-type semiconductor layer 20. For this reason, it is preferred that In is not contained in the fourth barrier layer 41 from the p-side barrier layer 41(n) and the barrier layers closer to the n-type semiconductor layer 20. Thereby, the average In composition ratio in the whole of the light emitting layer 40 can be kept low, and thus lattice mismatch between the light emitting layer 40 and the n-type semiconductor layer 20 does not excessively become large. As a result, the crystal quality in the case where the second layer HL containing In is provided in the barrier layers 41 can be prevented from degrading. In terms of crystal quality, it is desired to make the In composition ratio of the n-type barrier layer 41(1) small (preferably, 0).

As described above, with the configuration in which the first layer LL and the second layer HL are provided in the p-side barrier layer 41(n) and is not provided in the n-side barrier layer 41(1) (the configuration in which the average In composition ratio of the p-side barrier layer 41(n) is higher than the average In composition ratio of the n-side barrier layer 41(1)), the internal quantum efficiency QE_AV is increased.

FIG. 10A to FIG. 12 are views illustrating an In composition ratio profile of another semiconductor light emitting device according to the embodiment.

In all of FIG. 10A to FIG. 12, a horizontal axis represents position (position in the thickness direction) of the light emitting layer and a vertical axis represents the In composition ratio.

In all of the examples shown in FIG. 10A to FIG. 12, the In composition ratio profile in the multiple quantum well structure in which the eight barrier layers 41 and the eight well layers 42 are alternately stacked is shown.

Figure 10A:
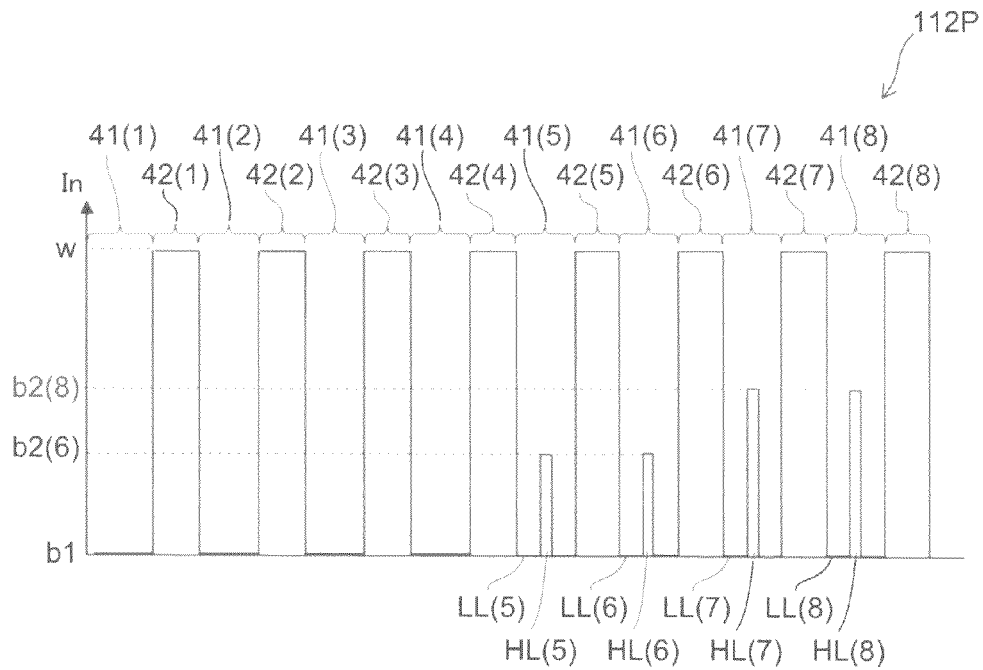
FIGS. 10A to 12 are views illustrating an In composition ratio profile of another semiconductor light emitting device according to the embodiment.
Figure 10B:
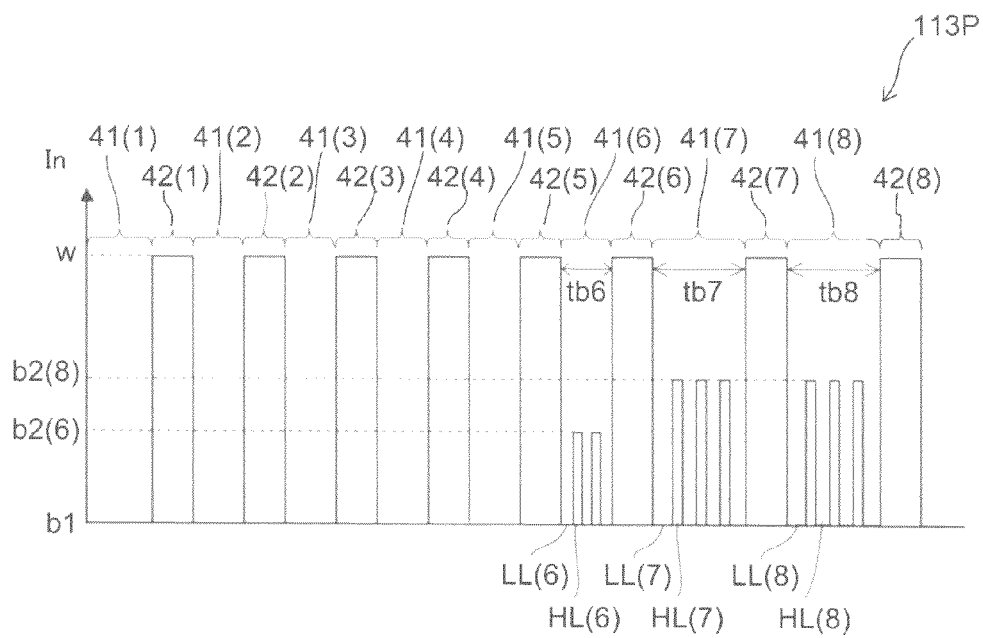
Figure 11A:
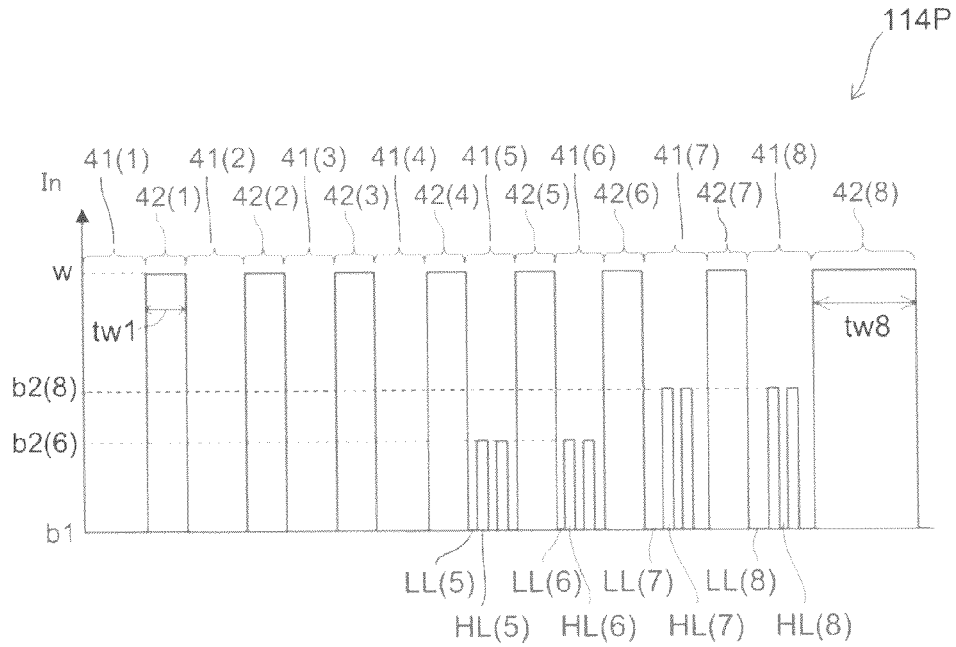
Figure 11B:
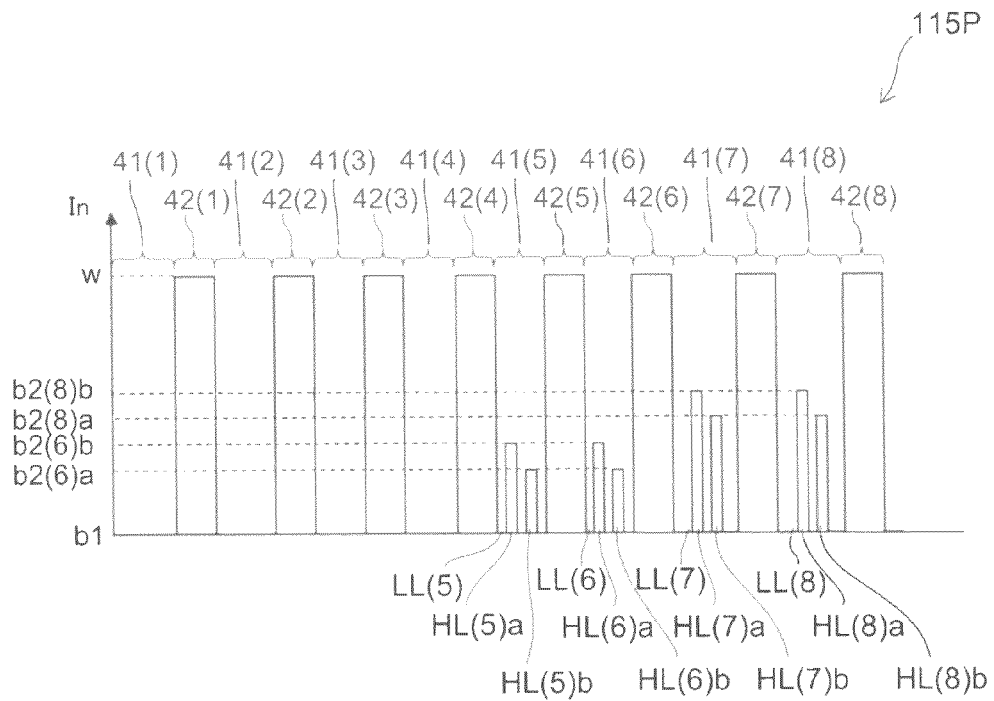
Figure 12:
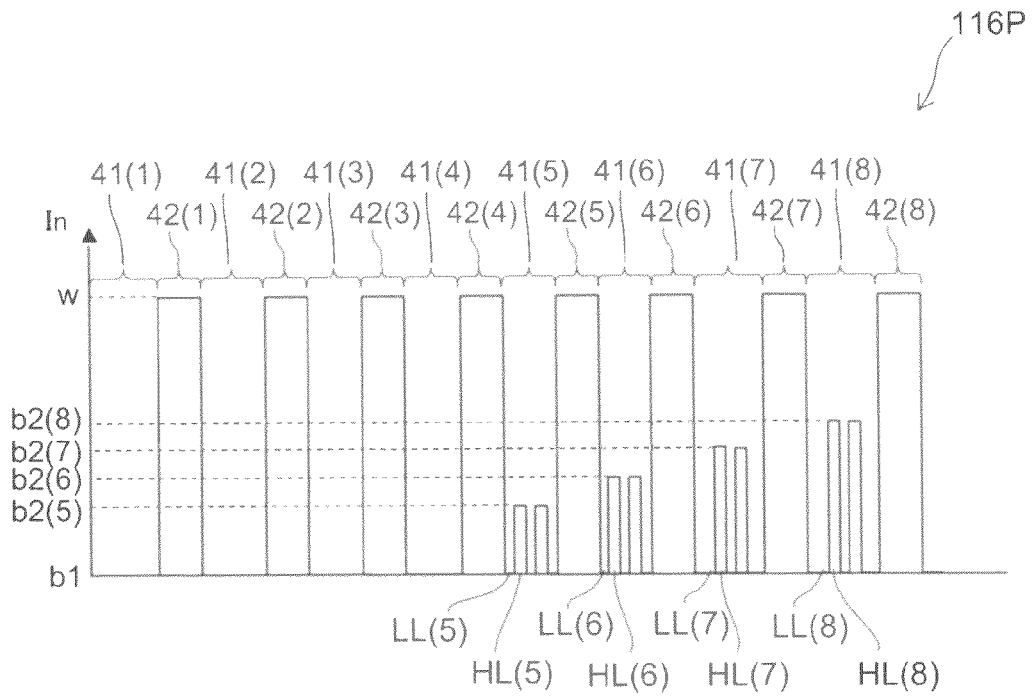

Here, the In composition ratio profile shown in FIG. 10A is referred to as 112P, the In composition ratio profile shown in FIG. 10B is referred to as 113P, the In composition ratio profile shown in FIG. 11A is referred to as 114P, the In composition ratio profile shown in FIG. 11B is referred to as 115P and the In composition ratio profile shown in FIG. 12 is referred to as 116P.

In each of the In composition ratio profiles 112P, 113P, 114P, 115P and 116P, the In composition ratio w of the well layers 42 are constant. As an example, the In composition ratio w is 0.13.

In the In composition ratio profile 112P shown in FIG. 10A, the two first layer LL and one second layer HL are provided in each of the eighth barrier layer 41(8) to the fifth barrier layer 41(5). The In composition ratios of these first layers LL are the same. The In composition ratio of the first layers LL is, for example, 0.00.

Among the plurality of barrier layers 41, the In composition ratios of the second layer HL(8) in the eighth barrier layer 41(8) and the second layer HL(7) in the seventh barrier layer 41(7) are the same. The In composition ratio b2(8) of the second layers HL(8) and HL(7) is, for example, 0.06.

Among the plurality of barrier layers 41, the In composition ratio of the second layer HL(6) in the sixth barrier layer 41(6) and the second layer HL(5) in the fifth barrier layer 41(5) are the same, but are lower than the In composition ratios b2(8) of the second layer HL(8) in the eighth barrier layer 41(8) and the second layer HL(7) in the seventh barrier layer 41(7). The In composition ratio b2(6) of the second layers HL(6) and HL(5) is, for example, 0.03.

With such configuration, in the In composition ratio profile 112P, the average In composition ratios in a stepwise fashion decreases in the pair of the eighth barrier layer 41(8) and the seventh barrier layer 41(7) and the pair of the sixth barrier layer 41(6) and the fifth barrier layer 41(5).

In the In composition ratio profile 113P shown in FIG. 10B, the first layers LL and the second layer HL are provided in the eighth barrier layer 41(8) to the sixth barrier layer 41(6). The four first layers LL and the three second layers HL are provided in each of the eighth barrier layer 41(8) and the seventh barrier layer 41(7). The three first layers LL and the two second layer HL are provided in the sixth barrier layer 41(6). That is, the number of the first layers LL is different from the number of second layers HL in the p-side barrier layer and the m-th barrier layer 41(m).

The In composition ratios of the first layers LL(8) to LL(6) provided in the eighth barrier layer 41(8) to the sixth barrier layer 41(6), respectively, are the same. The In composition ratios b1 of the first layers LL are, for example, 0.00.

The In composition ratios of the second layer HL(8) in the eighth barrier layer 41(8) and the second layer HL(7) in the seventh barrier layer 41(7) are the same. The In composition ratio b2(8) of the second layers HL(8) and HL(7) is, for example, 0.06.

The In composition ratio b2(6) of the sixth second layer HL(6) is lower than the In composition ratio b2(8) of the second layer HL(8) in the eighth barrier layer 41(8) and the second layer HL(7) in the seventh barrier layer 41(7). The In composition ratio b2(6) of the second layer HL(6) is, for example, 0.03.

Thicknesses $t_{b8}$ and $t_{b7}$ of the eighth barrier layer 41(8) and the seventh barrier layer 41(7) may be larger than a thickness $t_{b6}$ of the sixth barrier layer 41(6).

In the In composition ratio profile 114P shown in FIG. 11A, the two first layer LL and one second layer HL are provided in each of the eighth barrier layer 41(8) to the fifth barrier layer 41(5). Each In composition ratio in the first layers LL and the second layers HL is the same as the In composition ratio profile 110P shown in FIG. 3.

The In composition ratios of the first layers LL are the same. The In composition ratios b1 of the first layer LL each are, for example, 0.00.

The In composition ratio b2(8) of the second layer HL(8) in the barrier layer 41(8) and the second layer HL(7) in the barrier layer 41(7) is, for example, 0.06.

The In composition ratio b2(6) of the second layer HL(6) in the barrier layer 41(6) and the second layer HL(5) in the barrier layer 41(5) is, for example, 0.03.

In the composition ratio profile 114P, as compared with the In composition ratio profile 110P, a thickness $t_{w8}$ of the eighth well layer 42(8) as the p-side well layer that is closest to the p-type semiconductor layer 50 is larger than a thickness $t_{w1}$ of the first well layer 42(1) as the n-side well layer that is closest to the n-type semiconductor layer 20.

In the In composition ratio profile 115P shown in FIG. 11B, the three first layers LL and the two second layers HL are provided in each of the eighth barrier layer 41(8) to the fifth barrier layer 41(5). The In composition ratios of these first layers LL are the same. The In composition ratio b1 of the first layers LL is, for example, 0.00.

In the composition ratio profile 115P, the average In composition ratios in a stepwise fashion decrease in the pair of the eighth barrier layer 41(8) and the seventh barrier layer 41(7) and the pair of the sixth barrier layer 41(6) and the fifth barrier layer 41(5).

However, in the In composition ratio profile 115P, in each of the barrier layer 41 of the eighth barrier layer 41(8) to the fifth barrier layer 41(5), the In composition ratios of the plurality of second layers HL are varied.

The In composition ratios of the plurality of second layers HL provided in each of the eighth barrier layer 41(8) to the fifth barrier layer 41(5) increases from the p-type semiconductor layer 50 toward the n-type semiconductor layer 20.

For example, two second layers HL(8)$a$ and HL(8)$b$ are provided in the eighth barrier layer 41(8). An In composition ratio b2(8)$b$ of the second layer HL(8)$b$ provided closer to the p-type semiconductor layer 50 in the two second layers HL(8)$a$ and HL(8)$b$ is higher than an In composition ratio b2(8)$a$ of the second layer HL(8)$a$ provided closer to the n-type semiconductor layer 20.

Similarly, two second layers HL(7)$a$ and HL(7)$b$ are provided in the seventh barrier layer 41(7). The In composition ratio b2(8)$b$ of the second layer HL(7)$b$ provided closer to the p-type semiconductor layer 50 in the two second layers HL(7)$a$ and HL(7)$b$ is higher than the In composition ratio b2(8)$a$ of the second layer HL(7)$a$ provided closer to the n-type semiconductor layer 20.

Two second layers HL(6)$a$ and HL(6)$b$ are provided in the sixth barrier layer 41(6). An In composition ratio b2(6)$b$ of the second layer HL(6)$b$ provided closer to the p-type semiconductor layer 50 in the two second layers HL(6)$a$ and HL(6)$b$ is higher than an In composition ratio b2(6)$a$ of the second layer HL(6)$a$ provided closer to the n-type semiconductor layer 20.

Similarly, two second layers HL(5)$a$ and HL(5)$b$ are provided in the fifth barrier layer 41(5). The In composition ratio b2(6)$b$ of the second layer HL(5)$b$ provided closer to the p-type semiconductor layer 50 in the two second layers HL(5)$a$ and HL(5)$b$ is higher than the In composition ratio b2(6)$a$ of the second layer HL(5)$a$ provided closer to the n-type semiconductor layer 20.

The higher In composition ratio b2(8)$b$ of the In composition ratios of the plurality of second layers HL in the barrier layers 41(8) and 41(7) is, for example, 0.06.

The lower In composition ratio b2(8)$a$ of the In composition ratios of the plurality of second layers HL in the barrier layers 41(8) and 41(7) is 0.04.

The higher In composition ratio b2(6)$b$ of the In composition ratios of the plurality of second layers HL in the barrier layers 41(6) and 41(5) is, for example, 0.03.

The lower In composition ratio b2(6)$a$ of the In composition ratios of the plurality of second layers HL in the barrier layers 41(6) and 41(5) is 0.01.

In the In composition ratio profile 116P shown in FIG. 12, the three first layers LL and the two second layers HL are provided in each of the eighth barrier layer 41(8) to the fifth barrier layer 41(5). The In composition ratios of these first layers LL are the same. The In composition ratios of the first layers LL are, for example, 0.00.

In composition ratio profile 116P, the average In composition ratios of the eighth barrier layer 41(8), the seventh barrier layer 41(7), the sixth barrier layer 41(6) and the fifth barrier layer 41(5) in a stepwise fashion decreases in this order.

The In composition ratio b2(8) of the plurality of second layers HL(8) in the barrier layer 41(8) is, for example, 0.06.

The In composition ratio b2(7) of the plurality of second layers HL(7) in the barrier layer 41(7) is, for example, 0.05.

The In composition ratio b2(6) of the plurality of second layers HL(6) in the barrier layer 41(6) is, for example, 0.04.

The In composition ratio b2(5) of the plurality of second layers HL(5) in the barrier layer 41(5) is, for example, 0.03.

An example of characteristics in the case where configuration of the multiple quantum well structure according to the embodiment is changed will be described. In this example, the configuration of the second layer HL is changed.

Figure 13:
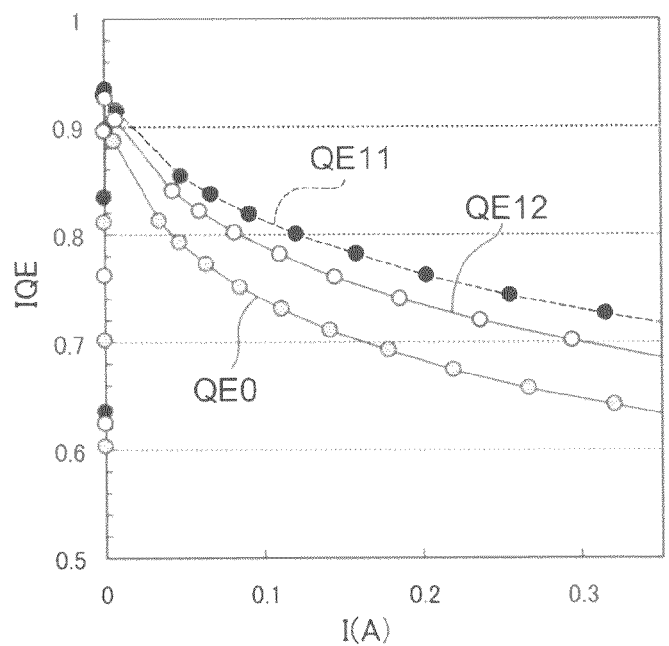
FIGS. 13 and 14 are views illustrating characteristics of the semiconductor light emitting device.
Figure 14:
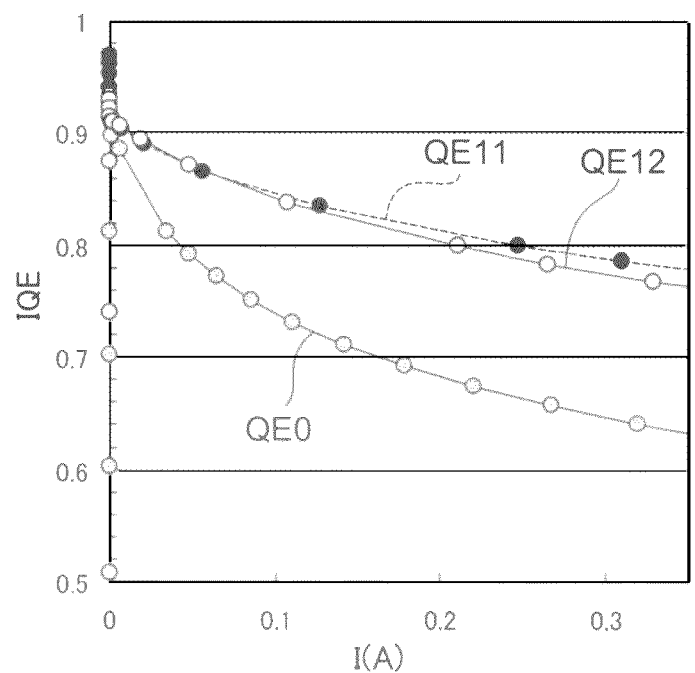

FIG. 13 and FIG. 14 are views illustrating characteristics of the semiconductor light emitting device.

In FIG. 13 and FIG. 14, a horizontal axis represents a current I(A), and a vertical axis represents an internal quantum efficiency IQE.

FIG. 13 shows an internal quantum efficiency QE11 according to a first configuration and an internal quantum efficiency QE12 according to a second configuration. An internal quantum efficiency QE0 is an internal quantum efficiency in the case of using the In composition ratio profile 190P according to the reference example.

In the first configuration and the second configuration, the eight barrier layers 41 and the eight well layers 42 are alternately stacked in the multiple quantum well structure, and two first layer LL and one second layer HL are provided in each of the eighth barrier layer 41(8) to the second barrier layer 41(2).

In the first configuration (internal quantum efficiency QE11), the In composition ratio b2 of the second layer HL is the same as the In composition ratio w of the well layers 42 (for example, b2=w=0.13).

In the second configuration (internal quantum efficiency QE12), the In composition ratio b2 of the second layer HL is lower than the In composition ratio w of the well layers 42 (for example, w=0.13, b2=0.08).

FIG. 14 shows an internal quantum efficiency QE21 according to a third configuration and an internal quantum efficiency QE22 according to a fourth configuration. As in FIG. 13, the internal quantum efficiency QE0 is the internal quantum efficiency in the case of using the In composition ratio profile 190P according to the reference example.

In the third configuration and the fourth configuration, the eight barrier layers 41 and the eight well layers 42 are alternately stacked in the multiple quantum well structure, and the three first layers LL and the two second layers HL are provided in each of the eighth barrier layer 41(8) to the second barrier layer 41(2).

In the third configuration (internal quantum efficiency QE21), the In composition ratio b2 of the second layer HL is the same as the In composition ratio w of the well layers 42 (for example, b2=w=0.13).

In the fourth configuration (internal quantum efficiency QE22), the In composition ratio b2 of the second layer HL is lower than the In composition ratio w of the well layers 42 (for example, w=0.13, b2=0.08).

As shown in FIG. 13, the internal quantum efficiency QE11 according to the first configuration and the internal quantum efficiency QE12 according to the second configuration each are higher than the internal quantum efficiency QE0 according to the reference example. The internal quantum efficiency QE11 is higher than the internal quantum efficiency QE12. When the one second layer HL is provided in the one barrier layer 41, as the In composition ratio of the second layer HL is higher, the quantum efficiency becomes higher.

As shown in FIG. 14, the internal quantum efficiency QE21 according to the third configuration and the internal quantum efficiency QE22 according to the fourth configuration each are higher than the internal quantum efficiency QE0 according to the reference example. The internal quantum efficiency QE21 is approximately equal to the internal quantum efficiency QE22. When the two second layers HL are provided in the one barrier layer 41, an excellent internal quantum efficiency can be obtained irrespective of the In composition ratio of the second layer HL.

From the results shown in FIG. 13 and FIG. 14, it can be seen that by providing the two second layer HL in the one barrier layer 41, even when the In composition ratio per second layer HL is decreased, a good internal quantum efficiency can be obtained.

Although the In composition ratio in the group III elements in the first layer LL and the second layer HL is described in the above embodiment and examples, composition ratio of any element other than In is applicable.

The embodiment provides the semiconductor light emitting device having a high light emitting efficiency.

It is assumed that the "nitride semiconductor" in the specification includes semiconductors of all composition ratio obtained by changing the composition ratio of $\alpha$, $\beta$ and $\gamma$ in the corresponding range in a chemical formula: $B_\alpha In_{1-\alpha-\beta-\gamma} Al_\beta Ga_\gamma N$ ($0 \leq \alpha \leq 1$, $0 \leq \beta \leq 1$, $0 \leq \gamma \leq 1$, $\alpha+\beta+\gamma \leq 1$). The "nitride semiconductor" also includes semiconductors further containing a V group element other than N (nitrogen) or any of various dopants added to control conductive type or the like, in the above chemical formula.

The embodiment of the invention has been described with reference to the specific examples. However, the invention is not limited to these specific examples. For example, even when those skilled in the art modifies shape, size, material and arrangement of the constituents included in the semiconductor light emitting device, such as the n-type semiconductor layer, the p-type semiconductor layer, the active layer, the well layers, the barrier layer, the electrode, the substrate and the buffer element, as long as those skilled in the art can implement the invention by appropriately selecting them from the publicly known scope and obtain similar effects, such modification is included in the scope of the invention.

Any combination of two or more constituents in each of the specific examples in a technically executable scope also falls within the scope of the invention as long as it includes the subject matter of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   an n-type semiconductor layer containing a nitride semiconductor;
   a p-type semiconductor layer containing a nitride semiconductor; and
   a light emitting layer provided between the n-type semiconductor layer and the p-type semiconductor layer, the light emitting layer including a plurality of barrier layers and a plurality of well layers, being alternately stacked, a p-side barrier layer being closest to the p-type semiconductor layer among the plurality of barrier layers, the p-side barrier layer including a first and a second layer, the first layer containing group III elements, the second layer being stacked with the first layer, and the second layer containing group III elements, an In composition ratio in the group III elements of the second layer being higher than an In composition ratio in the group III elements of the first layer, or the first layer not containing In and the second layer containing In, and an average In composition ratio of the p-side barrier layer being higher than an average In composition ratio of an n-side barrier layer being closest to the n-type semiconductor layer among the plurality of barrier layers.

2. The device according to claim 1, wherein
a thickness of the first layer is less than 3 nanometers, and
a thickness of the second layer is not more than 2 nanometers.

3. The device according to claim 1, wherein
the plurality of barrier layers includes an intermediate barrier layer between the p-side barrier layer and the n-side barrier layer, and
the intermediate barrier layer includes
a third layer containing group III elements, and
a fourth layer being stacked with the third layer and containing group III elements, an In composition ratio in the group III elements of the fourth layer being higher than an In composition ratio in the group III elements of the third layer, and
an average In composition ratio of the intermediate barrier layer is lower than the average In composition ratio of the p-side barrier layer and is higher than the average In composition ratio of the n-side barrier layer.

4. The device according to claim 1, wherein
the In composition ratio of the first layer is not more than 0.02, and
the In composition ratio of the second layer is not more than 0.13.

5. The device according to claim 1, wherein
the In composition ratio of the first layer is 0.00, and
the In composition ratio of the second layer is not less than 0.08.

6. The device according to claim 3, wherein
the In composition ratio of the third layer is not more than 0.02, and
the In composition ratio of the fourth layer is not more than 0.13.

7. The device according to claim 3, wherein
the In composition ratio of the third layer is 0.00, and
the In composition ratio of the fourth layer is not less than 0.08.

8. The device according to claim 1, wherein the In composition ratio of the second layer is not more than half of the In composition ratio of a p-side well layer being closest to the p-type semiconductor layer of the plurality of well layers.

9. The device according to claim 1, wherein
a thickness of a p-side well layer being closest to the p-type semiconductor layer of the plurality of well layers is larger than a thickness of a n-side well layer being closest to the n-type semiconductor layer of the plurality of well layers.

10. The device according to claim 1, wherein
a thickness of each of the plurality of barrier layers is not more than 10 nanometers, and
a thickness of each of the plurality of well layers is not less than 3 nanometers and not more than 6 nanometers.

11. The device according to claim 1, wherein a band gap energy of the second layer is smaller than a band gap energy of the first layer.

12. The device according to claim 1, wherein the first layer and the second layer are included in a plurality in the p-side barrier layer, the first layer and the second layer being alternately stacked.

13. The device according to claim 3, further including the intermediate barrier layer in a plurality, the third layer and the fourth layer being provided in each of the plurality of intermediate barrier layers.

14. The device according to claim 3, wherein the third layer and the fourth layer are included in a plurality in the intermediate barrier layer, the third layer and the fourth layer being alternately stacked.

15. The device according to claim 3, wherein
a thickness of the third layer is less than 3 nanometers, and
a thickness of the fourth layer is not more than 2 nanometers.

16. The device according to claim 3, wherein an average In composition ratio of the intermediate barrier layer decreases in a stepwise fashion from the intermediate barrier layer close to the p-type semiconductor layer toward the intermediate barrier layer close to the n-type semiconductor layer.

17. The device according to claim 1, wherein an average In composition ratio of the intermediate barrier layer is larger as the intermediate barrier layer is closer to the p-type semiconductor layer, and is smaller as the intermediate barrier layer is closer to the n-type semiconductor layer.

18. The device according to claim 12, wherein each of the In composition ratios of the plurality of second layers is larger as the second layers are closer to the p-type semiconductor layer, and is smaller as the second layers are closer to the n-type semiconductor layer.

19. The device according to claim 1, wherein
the plurality of barrier layers is provided in at least one additional plurality, such that when an adjacent plurality of the barrier layers are set to one pair and the pair is configured in a plurality, the adjacent plurality of the barrier layers have one common average In composition ratio in the one pair.

20. The device according to claim 19, wherein the average In composition ratio of the adjacent plurality of the barrier layers in the one pair decreases in a stepwise fashion from the p-type semiconductor layer toward the n-type semiconductor layer.

* * * * *